United States Patent
Pike et al.

(10) Patent No.: US 6,326,319 B1
(45) Date of Patent: Dec. 4, 2001

(54) METHOD FOR COATING ULTRA-THIN RESIST FILMS

(75) Inventors: Christopher L. Pike, Fremont; Khanh B. Nguyen, Sunnyvale; Christopher F. Lyons, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/609,746

(22) Filed: Jul. 3, 2000

(51) Int. Cl.$^7$ ....................................... H01F 10/02
(52) U.S. Cl. ................ 438/782; 438/758; 438/760; 438/780; 427/447; 427/452; 427/473; 427/485; 427/489
(58) Field of Search ................. 438/758, 760, 438/780, 782; 427/447, 452, 473, 485, 489

(56) References Cited

U.S. PATENT DOCUMENTS

| 5,066,616 | 11/1991 | Gordon . |
| 5,306,523 | 4/1994 | Shibata . |
| 5,658,615 | 8/1997 | Hasebe et al. . |
| 5,919,520 | 7/1999 | Tateyama et al. . |

*Primary Examiner*—Charles Bowers
*Assistant Examiner*—Lisa Kilday
(74) *Attorney, Agent, or Firm*—Davis Chin

(57) ABSTRACT

There is provided a method for applying a lower viscosity coating liquid onto a semiconductor wafer substrate so as to prevent adhesion loss and to maintain low defect level characteristics. This is achieved by priming the substrate with a bonding agent at a temperature in the range of 18° C. to 50° C. for a short amount of time. This is performed prior to the application of a liquid solvent. As a result, there is overcome the problems of poor adhesion to the substrates and high defect levels in the coated UTR films.

4 Claims, 1 Drawing Sheet

METHOD FOR COATING ULTRA-THIN RESIST FILMS

BACKGROUND OF THE INVENTION

This invention relates generally to manufacturing processes for fabricating semiconductor integrated circuit devices. More particularly, it relates to an improved method of applying a lower viscosity coating liquid onto a semiconductor wafer substrate so as to maintain the desired adhesion and defect characteristics thereof.

As is generally known to those in the semiconductor industries, there is a continuing trend of manufacturing semiconductor integrated circuits with higher and higher densities on a smaller chip area. As a consequence of this desire for large scale integration, this has led to a continued shrinking of the circuit dimensions and features of the devices so as to reduce manufacturing costs and to improve circuit functionality. The ability to reduce the size structures such as shorter gate lengths in field-effect transistors is driven by lithographic technology which is, in turn, dependent upon the wavelength of light used to expose the photoresist. Currently, optical steppers expose the photoresist using light having a wavelength of 248 nm is widely used in manufacturing, but a radiation having a wavelength of 193 nm is being experimented in research and development laboratories. Further, the next generation lithographic technologies will in all likelihood progress toward a radiation having a wavelength of 157 nm and even shorter wavelengths, such as those used in Extreme Ultra-Violet (EUV) lithography (≈13 nm).

As the wavelength of the radiation decreases, such classic image exposure techniques cannot be used to satisfactorily generate the pattern linewidths in the photoresist of greater than 0.25 $\mu$m (2500 Å). This is due to the fact that the organic-based photoresist materials will become increasingly opaque to the radiation. In order to overcome this drawback, there has been developed in recent years the use of ultra-thin resist (UTR) coatings in order to maintain the desired characteristics of the masked photoresist structures (e.g., near vertical sidewalls for the resist profiles, maximum exposure/focus latitude). In the current state-of-the-art, integrated circuit manufacturers have been using in the resist process a resist coating having a standard photoresist thickness of more than 0.5 $\mu$m (5,000 Å) for 248 nm lithography and 0.4 $\mu$m (4,000 Å) for 193 nm lithography. Thus, a resist coating having an UTR thickness is considered to be resist films of less than 0.25 $\mu$m (2500 Å) in thickness.

However, the application of a UTR coating is not without any problems. In order to apply the UTR coatings having thicknesses of 2,500 Å or less, the viscosity of the photoresist materials must be significantly less than those currently used in the state-of-the-art photoresists. The use of such lower viscosity photoresist materials suffers from the disadvantage that they exhibit poor adhesion to the substrates and high defect levels in the coated films when using the standard or conventional coating procedures.

Accordingly, there exists a need of developing a way of applying a lower viscosity photoresist material to the substrates but yet can still maintain the desired adhesion and low defect level characteristics of the photoresist film. This is achieved in the present invention by utilizing a priming step in which the substrate surface is pre-coated with a bonding agent for a short amount of time at room temperature prior to the step of applying a liquid solvent to the surface of the substrate.

SUMMARY OF THE INVENTION

Accordingly, it is a general object of the present invention to provide an improved method of applying a lower viscosity coating liquid onto a semiconductor substrate.

It is an object of the present invention to provide a method of applying a lower viscosity coating liquid onto a semiconductor substrate so as to prevent adhesion loss and to maintain low defect level characteristics.

It is another object of the present invention to provide a method of applying a lower viscosity coating liquid onto a semiconductor substrate which includes priming the substrate surface with a bonding agent for a short amount of time at about room temperature.

In a preferred embodiment of the present invention, there is provided a method of applying a lower viscosity coating liquid onto a semiconductor wafer substrate so as to prevent adhesion loss and to maintain low defect level characteristics. The substrate is primed with a bonding agent at a temperature in the range of 18° C. to 50° C. A liquid solvent is applied over the entire surface of the primed substrate. The substrate is spun with the liquid solvent applied thereon so as to remove substantially all of the liquid solvent. A lower viscosity coating liquid is applied onto the surface of the substrate over the top of the liquid solvent. The coated substrate is spun so as to obtain a coating layer having a thickness of less then 2,500 Å.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
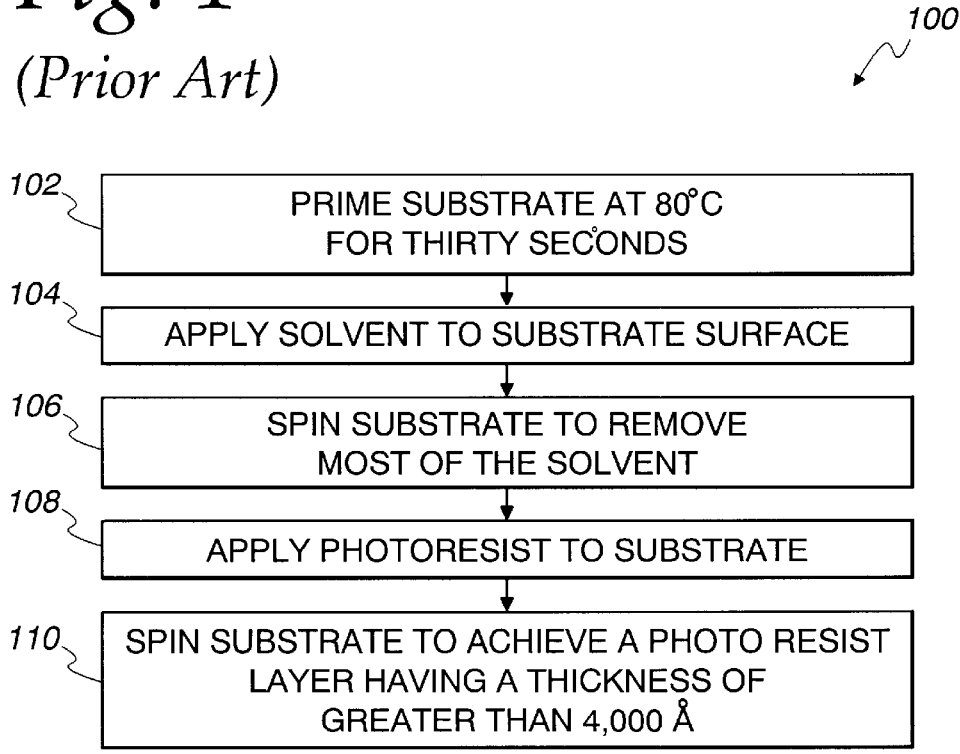
FIG. 1 is a process flow of a photoresist coating procedure in accordance with standard coating techniques.
Figure 2:
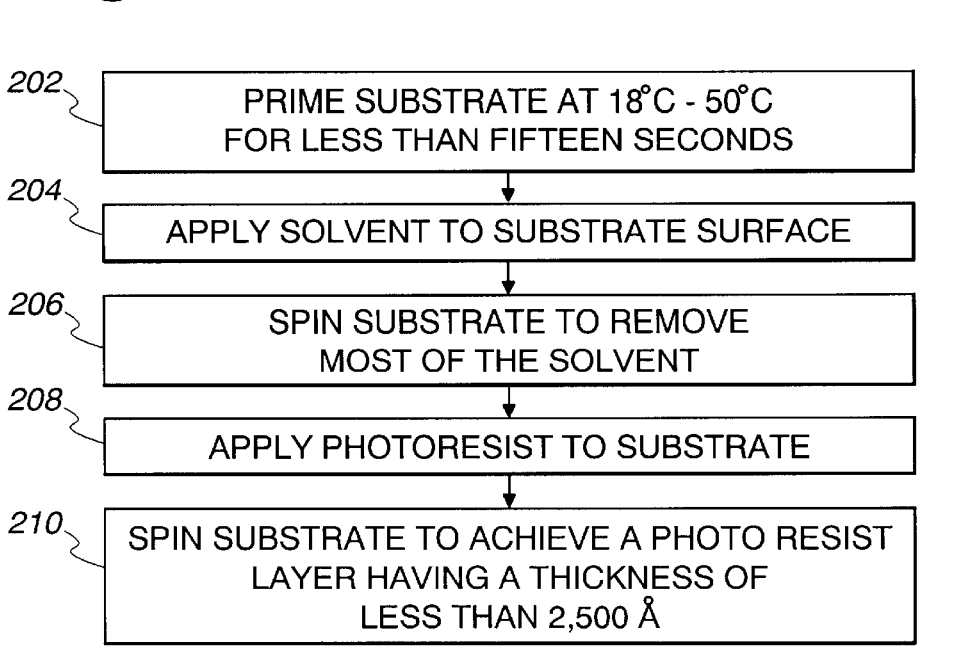
FIG. 2 is a flow process of a lower viscosity UTR coating method, as taught in accordance with the principles of the present invention.

As a background and in order to assist in understanding the present invention, a conventional photoresist coating procedure for applying a standard resist having a thickness greater than 4,000 Å will be initially described with reference to a process flow 100 of FIG. 1. As can be seen, in a first priming step 102 a bonding agent is applied to the surface of a suitable substrate at a temperature of 80° C. for 30 seconds. The bonding agent is preferably hexamethyldisilazane (HMDS) vapor. After the substrate has been primed, the substrate in a second step 104 has applied thereon its entire surface a liquid solvent. The solvent accumulates on the surface of the substrate to an initial thickness.

Next, in the step 106 a turntable is operated at a speed of approximately 2,000 r.p.m. for several seconds so as to remove substantially all of the liquid solvent. A predetermined quantity of a coating liquid such as a photoresist liquid is disposed onto the substrate surface over the top of the liquid solvent film with the turntable still spinning slowly, as shown in step 108. The photoresist liquid will be spread over the entire substrate surface, as it is being discharged. In the step 110, the photoresist-coated substrate is spun at a speed in the range of 1,000–5,000 r.p.m. for a certain time so as to obtain a photoresist layer having a thickness greater than 4,000 Å.

However, when these conventional photoresist coating procedures were applied so as to obtain a lower viscosity ultra-thin resist (UTR) film having a final thickness of less than 2,500 Å, it was observed that there was exhibited poor adhesion of the UTR film to the substrate. Further, there were found high defect levels in the coated UTR films. It has been discovered by the inventors of the present invention that by performing the priming step at or near room temperature for a short amount of time, unlike the prior art priming step, the adhesion loss and high defect levels of the UTR films could be prevented.

The instant invention will now be described in detail with reference to the process flow 200 as taught in accordance with the principles of the present invention. As can be seen, prior to the application of liquid solvent to the suitable substrate, in the unique prime step 202 a bonding agent such as HMDS vapor is applied to the surface of the substrate at a temperature in the range of 18° C. to 50° C. The length of time is to be very short and on the order of less than 15 seconds. This novel priming step 202 serves to overcome the poor film adhesion and high defect level problems when using the lower viscosity UTR materials.

After the substrate has been uniquely primed, a liquid solvent is applied over the entire surface of the substrate in the step 204. The liquid solvent accumulates on the surface of the substrate to an initial thickness. Next, in the step 206 the turntable is operated at a speed of approximately 2,000 r.p.m. for several seconds so as to remove substantially all of the liquid solvent. Then, a predetermined quantity of a coating liquid is dispensed onto the substrate surface over the top of the liquid solvent film with the turntable still spinning slowly. This is illustrated in the step 208. Finally, in the step 210 the photoresist-coated substrate is spun at a speed in the range of 1,000–5,000 r.p.m. for a certain time so as to obtain a photoresist layer having a thickness of less than 2,500 Å.

From the foregoing detailed description, it can thus be seen that the present invention provides a method of applying a lower viscosity coating liquid onto a semiconductor wafer substrate so as to prevent adhesion loss and to maintain low defect level characteristics. This is achieved by priming the substrate with a bonding agent at a temperature in the range of 18° C. to 50° C. which is performed prior to the application of a liquid solvent. The priming step serves to overcome the poor film adhesion and low defect level problems when utilizing the lower viscosity UTR materials.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method of applying a lower viscosity coating liquid onto a semiconductor wafer substrate so as to prevent adhesion loss and to maintain low defect level characteristics, said method comprising the steps of:

priming the substrate with a bonding agent at a temperature in the range of 18° C. to 50° C.;

applying a liquid solvent over the entire surface of the primed substrate;

spinning the substrate with the liquid solvent applied thereon so as to remove substantially all of the liquid solvent;

applying a lower viscosity coating liquid onto the surface of the substrate over the top of the liquid solvent; and spinning the coated substrate so as to obtain a coating layer having a thickness of less than 2,500 Å.

2. A method of applying a lower viscosity coating liquid as claimed in claim 1, wherein the lower viscosity liquid is a photoresist liquid.

3. A method of applying a lower viscosity coating liquid as claimed in claim 1, wherein the priming step is conducted for less than 15 seconds.

4. A method of applying a lower viscosity coating liquid as claimed in claim 1, wherein the bonding agent is a HMDS vapor.

\* \* \* \* \*